(12) United States Patent
Watanabe et al.

(10) Patent No.: US 12,484,267 B2
(45) Date of Patent: Nov. 25, 2025

(54) SEMICONDUCTOR DEVICE AND METHOD OF MANUFACTURING SEMICONDUCTOR DEVICE

(71) Applicant: HITACHI, LTD., Tokyo (JP)

(72) Inventors: Naoki Watanabe, Tokyo (JP); Yuan Bu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 484 days.

(21) Appl. No.: 17/922,428

(22) PCT Filed: Jun. 3, 2021

(86) PCT No.: PCT/JP2021/021235
§ 371 (c)(1),
(2) Date: Oct. 31, 2022

(87) PCT Pub. No.: WO2021/261203
PCT Pub. Date: Dec. 30, 2021

(65) Prior Publication Data
US 2023/0197782 A1 Jun. 22, 2023

(30) Foreign Application Priority Data
Jun. 26, 2020 (JP) .................. 2020-110224

(51) Int. Cl.
H10D 62/13 (2025.01)
H01L 21/268 (2006.01)
(Continued)

(52) U.S. Cl.
CPC ......... H10D 62/137 (2025.01); H01L 21/268 (2013.01); H10D 12/01 (2025.01); H10D 62/133 (2025.01); H10D 62/8325 (2025.01)

(58) Field of Classification Search
CPC ............. H10D 62/8325; H10D 12/441; H10D 12/032; H10D 64/62
See application file for complete search history.

(56) References Cited

U.S. PATENT DOCUMENTS 8,367,507 B1    2/2013  Tsuchiya et al.
2010/0327313 A1  12/2010 Nakamura
(Continued)

FOREIGN PATENT DOCUMENTS

JP   2011-044688 A   3/2011
JP   2013-058602 A   3/2013
(Continued)

OTHER PUBLICATIONS

Laariedh et al. ("The role of nickel and titanium in the formation of ohmic contacts on p-type 4H—SiC"; Semicond. Sci. Technol. 28 (2013) 045007 (Year: 2013).*
(Continued)

Primary Examiner — Syed I Gheyas
(74) Attorney, Agent, or Firm — Miles & Stockbridge, P.C.

(57) ABSTRACT

To realize a highly reliable IGBT that suppresses the bipolar degradation by preventing the occurrence of a defect on a boundary between a contact region and a silicide layer. As a means to realize the above, a semiconductor device includes: a collector region that is formed on a lower surface of a semiconductor substrate and forms an IGBT; and a collector electrode that is formed on a lower surface of the collector region via a silicide layer. The collector region and the silicide layer contains aluminum, first metal being more easily bondable to silicon than aluminum, and second metal being more easily bondable to carbon than aluminum.

11 Claims, 8 Drawing Sheets

(51) Int. Cl.
 *H10D 12/01* (2025.01)
 *H10D 62/832* (2025.01)

(56) References Cited

U.S. PATENT DOCUMENTS

| | | | |
|---|---|---|---|
| 2011/0018005 A1 | 1/2011 | Nakano | |
| 2012/0056201 A1 | 3/2012 | Wada et al. | |
| 2013/0062624 A1 | 3/2013 | Tsuchiya et al. | |
| 2015/0087125 A1 | 3/2015 | Nishio et al. | |
| 2016/0308003 A1* | 10/2016 | Hirakata | H10D 62/8325 |
| 2018/0277667 A1 | 9/2018 | Sekiguchi et al. | |
| 2019/0081136 A1* | 3/2019 | Yen | H10D 30/028 |

FOREIGN PATENT DOCUMENTS

| | | | |
|---|---|---|---|
| JP | 2013-058603 A | 3/2013 |
| JP | 2015-061001 A | 3/2015 |
| JP | 2015-192121 A | 11/2015 |
| JP | 2018-056584 A | 4/2018 |
| JP | 2018-160594 A | 10/2018 |
| WO | 2010131573 A1 | 11/2010 |
| WO | 2016030963 A1 | 3/2016 |

OTHER PUBLICATIONS

Search Report mailed Aug. 24, 2021 in International Application No. PCT/JP2021/021235.
Written Opinion mailed Aug. 24, 2021 in International Application No. PCT/JP2021/021235.

\* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing a semiconductor device, and more particularly to an IGBT.

BACKGROUND ART

In forming an insulated gate bipolar transistor (IGBT), to reduce a contact resistance between a semiconductor substrate and a collector electrode, there has been known a case where a silicide layer is formed on a back surface of the semiconductor substrate and, thereafter, the collector electrode made of metal is formed below the silicide layer.

Patent literature 1 (Japanese Unexamined Patent Application Publication No. 2018-56584) discloses a technique where a silicide layer is formed on a back surface of a semiconductor substrate that includes an IGBT and between a p-type collector region and a collector electrode. Patent literature 1 also describes that Ni, Co or Ti is used as a material of the silicide layer, and Al (aluminum) is used as a material of the collector electrode.

Patent literature 1 also describes that, to prevent the occurrence of a phenomenon that a carrier lifetime is deteriorated attributed to the generation of a defect in a p-type collector region or an n-type buffer region, laser annealing is applied to the back surface of the substrate on which the p-type collector region is formed.

CITATION LIST

Patent Literature

Patent Literature 1: Japanese Unexamined Patent Application Publication No. 2018-56584

SUMMARY OF INVENTION

Technical Problem

In forming an IGBT on an n-type SiC substrate, a method is considered where a p-type layer that is a collector region and an n-type layer that is a drift layer are sequentially formed on the SiC substrate by an epitaxial growth method and, thereafter, the SiC substrate is removed by grinding, and a collector electrode is connected to a bottom surface of the p-type layer via silicide layer. However, at the time of forming the silicide layer, there is a possibility that a defect is generated on the bottom surface of the p-type layer. Such a defect may cause the bipolar degradation to a semiconductor element.

It is an object of the present invention to enhance the reliability of a semiconductor device. Particularly, the present invention aims at the prevention of the generation of a defect in a boundary between a contact region and a silicide layer thus realizing a highly reliable IGBT that can suppress the bipolar degradation.

The above-mentioned and other objects and novel technical features of the present invention will become apparent from the description of this specification and attached drawings.

Solution to Problem

To briefly describe the summary of representative technical features out of an embodiment disclosed in this application, they are as follows.

A semiconductor device according to an embodiment is a semiconductor device that includes: a semiconductor substrate; a collector region of a first conductive type that is formed on a lower surface of the semiconductor substrate; a first semiconductor region of a second conductive type that differs from the first conductive type, the first semiconductor region being formed on the collector region in the semiconductor substrate; a second conductor region of the first conductive type, the second conductor region being formed from an upper surface of the semiconductor substrate to an intermediate depth in the first semiconductor region; an emitter region of the second conductive type, the emitter region being formed from an upper surface of the second semiconductor region to an intermediate depth of the second semiconductor region, the emitter region being spaced apart from the first semiconductor region; a gate electrode formed on the semiconductor substrate by way of an insulation layer in a state where the gate electrode covers the second semiconductor region between the emitter region and the first semiconductor region; a silicide layer being formed in a state where the silicide layer is brought into contact with a lower surface of the collector region; and a collector electrode being formed in a state where the collector electrode is brought into contact with a lower surface of the silicide layer. The collector region, the emitter region and the gate electrode form an insulation bipolar transistor, and the silicide layer contains aluminum, first metal being easily bondable with silicon than aluminum, and second metal being easily bondable with carbon than aluminum.

Advantageous Effects of Invention

To describe advantageous effects acquired by the representative inventions among the present invention disclosed in the present application, they are as follows.

According to the present invention, it is possible to realize the reliability of the semiconductor device. Particularly, it is possible to realize a highly reliable IGBT that suppresses the bipolar degradation by preventing the occurrence of a defect on a boundary between a contact region and a silicide layer.

DESCRIPTION OF EMBODIMENTS

Figure 1:
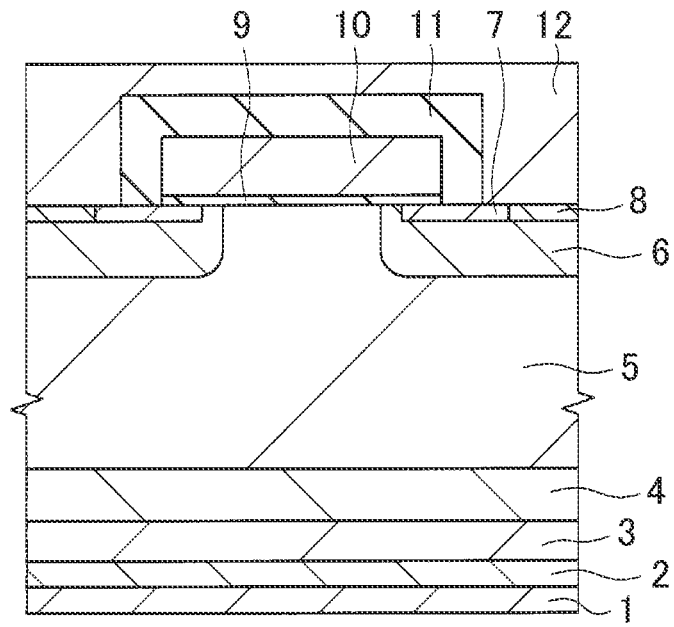
FIG. 1 is a cross-sectional view illustrating a semiconductor device according to an embodiment.

Hereinafter, an embodiment of the present invention is described with reference to drawings. In all drawings for the description of the embodiments, the same symbol is given to members having the same function and the repeated explanation of these members is omitted. Further, in the embodiment described hereinafter, unless otherwise specified, the description of the same portions or the substantially same portions is not basically repeated. Further, with respect to drawings used for describing the embodiment, to facilitate the understanding of the configurations, hutching may be also given to a plan view, a perspective view and the like. Further, in the drawings for describing the embodiment, to facilitate the understanding of the configurations, there may be cases where hutching is omitted in cross-sectional views.

Further, "−" and "+" are symbols expressing the dopant concentration in a case where a conductive type is an n-type or a p-type. For example, the dopant concentration of an n-type dopant is increased in order of "n$^-$", "n", "n$^+$".

<Detail of Room for Improvement>

Figure 11:
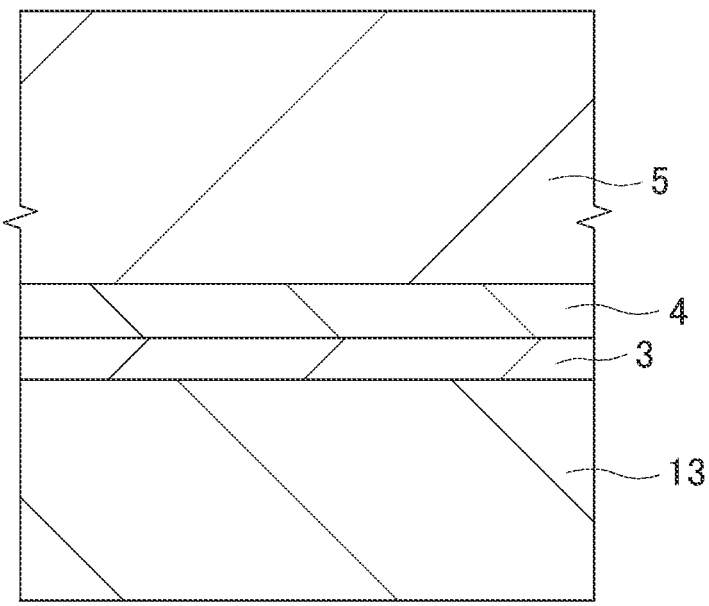
FIG. 11 is a cross-sectional view illustrating a manufacturing step of a semiconductor device according to a comparison example
Figure 12:
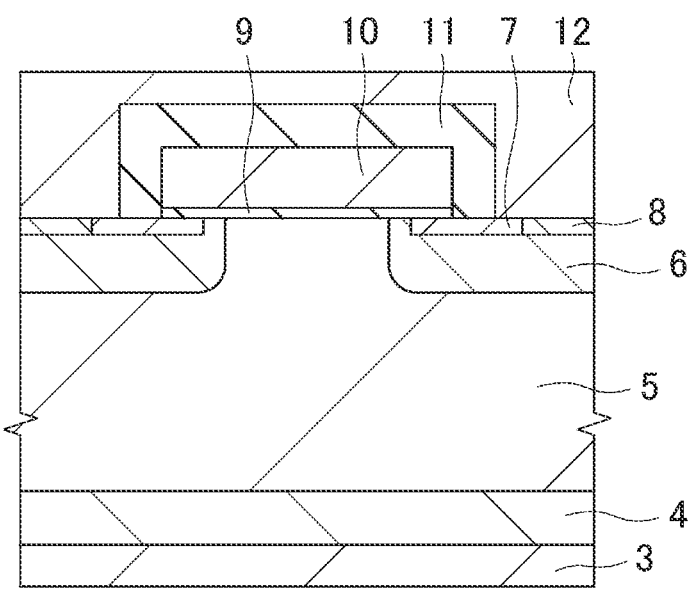
FIG. 12 is a cross-sectional view illustrating a manufacturing step of the semiconductor device according to the embodiment subsequent to the manufacturing step illustrated in FIG. 11.
Figure 13:
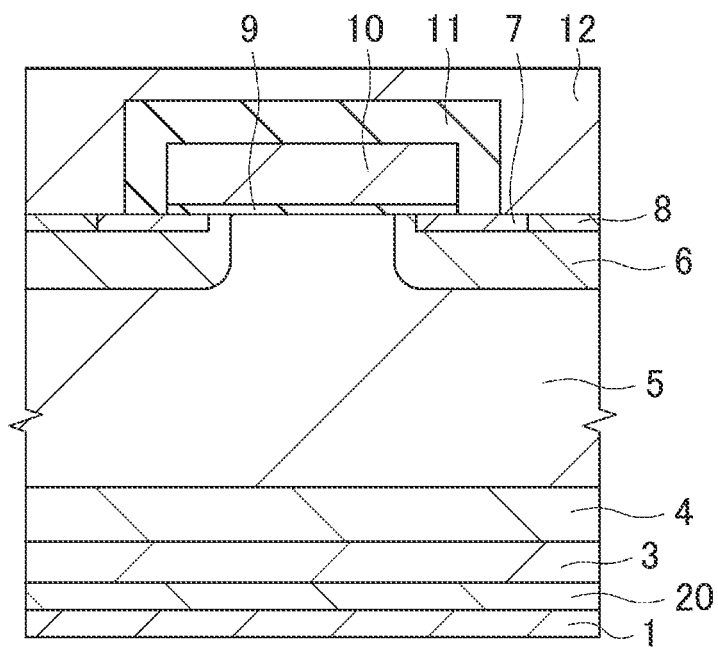
FIG. 13 is a cross-sectional view illustrating a manufacturing step of the semiconductor device according to the embodiment subsequent to the manufacturing step illustrated in FIG. 12.
Figure 14:
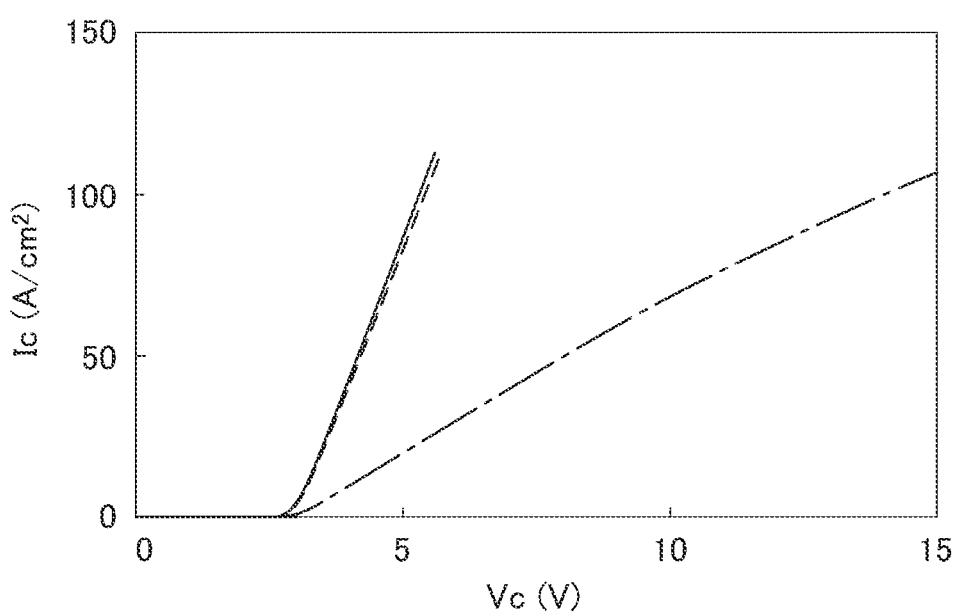
FIG. 14 is a graph illustrating a current-voltage characteristic by the supply of electricity in the semiconductor device according to the comparative example.

Hereinafter, the detail of room for improvement is described with reference to FIG. 11 to FIG. 14. FIG. 11 to FIG. 13 are cross-sectional views illustrating manufacturing steps of a semiconductor device that is a comparative example. FIG. 14 is a graph illustrating a current-voltage characteristic by the supply of electricity in the semiconductor device according to the comparative example.

Here, a phenomenon is described where, in forming an insulated gate bipolar transistor (IGBT) on a semiconductor substrate, a silicide layer is formed between a collector region on a lower surface of the semiconductor substrate and a collector electrode so that a defect is generated whereby the bipolar degradation occurs. In the present invention, the semiconductor substrate includes, not only a bulk substrate, but also a stacked substrate that includes the bulk substrate and an epitaxial layer formed on the bulk substrate, and an epitaxial substrate that is formed of only an epitaxial layer eliminating a bulk substrate on a lower portion of the stacked substrate.

First, as illustrated in FIG. 11, in a comparative example, an n$^+$-type silicon carbide (SiC) substrate 13 that is made of silicon carbide (SiC) is prepared. Subsequently, a p$^+$-type collector region 3, an n-type buffer layer 4, and an n$^-$-type drift layer 5 are formed on the SiC substrate 13 in this order by an epitaxial growth method. The collector region 3 contains, for example, aluminum (Al) as a dopant.

Next, as described in FIG. 12, a p-type body layer 6, an n$^+$-type emitter region 7 and a p$^+$-type body layer contact region 8 are formed on an upper surface of the drift layer 5. Subsequently, after forming a gate electrode 10 on the drift layer 5 by way of a gate insulation film 9, an interlayer insulation film 11 that covers the gate electrode 10 is formed. Subsequently, after a through hole that penetrates the interlayer insulation film 11 is formed, an emitter electrode 12 is formed on the interlayer insulation film 11. A portion of the emitter electrode 12 is embedded in the through hole, and is electrically connected to the emitter region 7 and the body layer contact region 8. With such a configuration, the IGBT that includes the gate electrode 10, the emitter region 7 and the collector region 3 is formed.

Subsequently, in a grinding step, the SiC substrate 13 is removed so that the collector region 3 is exposed. In a case where an n-channel IGBT is formed on the semiconductor substrate containing SiC, a back surface side of the semiconductor substrate becomes a p-type layer that is the collector region 3. Here, an SiC substrate having high quality exists only in an n-type. Accordingly, in a manufacturing process, the entire stacked structure formed of the collector region 3, the buffer layer 4 and the drift layer 5 as described above is formed by an epitaxial growth method, and the SiC substrate 13 that is a bulk substrate is removed by grinding.

Subsequently, as illustrated in FIG. 13, after forming a silicide layer 20 on a lower surface of the collector region 3, a collector electrode 1 that is brought into contact with a lower surface of the silicide layer 20 is formed. The collector electrode 1 is connected to the collector region 3 via the silicide layer 20 by an ohmic contact. The IGBT that forms the comparative example is completed as described above.

In forming the silicide layer 20 described above, a metal layer that contains titanium (Ti) and Al (aluminum), for example, is stacked on a lower surface of the collector region 3 and, thereafter, the metal layer and the semiconductor substrate are made to react with each other by applying laser annealing to the lower surface of the collector region 3 thus forming the silicide layer 20. However, in this step, there is a possibility that a defect is generated in a boundary between a back surface of the semiconductor substrate and the silicide layer 20.

The IGBT is a bipolar device, and has a drawback that bipolar degradation illustrated in FIG. 14 occurs by carrier recombination. In FIG. 14 that is a graph, a collector voltage is taken on an axis of abscissas, and a collector current is taken on an axis of ordinate. In FIG. 14, a state is illustrated where, when a stress current is continuously supplied to the semiconductor device of the comparative example that includes the IGBT, a current-voltage characteristic is degraded with a lapse of time. In FIG. 14, a graph at the time of starting supplying of a current is indicated by a solid line, a graph after a lapse of 50 hours from starting supplying of the current is indicated by a broken line, and a graph after a lapse of 100 hours from starting supplying of the current is indicated by a chained line.

As illustrated in FIG. 14, in the IGBT according to the comparative example, the current-voltage characteristic is apparently degraded along with a lapse of time during which a current flows. This is caused attributed to the above-mentioned defect that is formed on the boundary between the back surface of the semiconductor substrate and the silicide layer. As a metal layer (silicide metal) used for forming a silicide layer that is formed in a state where the silicide layer is brought into contact with the p-type semiconductor substrate that contains SiC, the use of Ti/Al is considered. However, it is difficult to form a compound between Ti or Al and silicon (Si) and hence, Si takes a solid solution state and a Si-rich silicide region having a high Si content is formed. It is considered that an in-lattice distance of SiC in the vicinity of the boundary between the semiconductor substrate and the silicide layer is distorted by being affected by such formation of the silicide region so that the above-mentioned defect is generated.

To the contrary, in a case where a silicide layer is not formed on a back surface of a semiconductor substrate for preventing the formation of such a defect, a contact resistance between a collector region and a collector electrode is increased so that performances of a semiconductor device is lowered. Accordingly, it is necessary to suppress the formation of a defect in the silicide forming step.

In this manner, in the IGBT where the silicide layer is formed on the back surface of the semiconductor device, the prevention of the bipolar degradation exists as room for improvement.

In view of the above, in the embodiment of the present invention, an idea that can overcome the above-mentioned room for improvement is devised. Hereinafter, the technical concept according to the embodiment that has devised the idea is described.

Embodiment

Hereinafter, a semiconductor device is described with reference to drawings by taking an IGBT that contains SiC as an example.

<Structure of Semiconductor Device>

The structure of the IGBT of the semiconductor device according to this embodiment is described with reference to FIG. 1. FIG. 1 is a cross-sectional view illustrating the semiconductor device according to this embodiment.

As illustrated in FIG. 1, the semiconductor device according to this embodiment has a semiconductor substrate (epitaxial substrate) that contains silicon carbide (SiC). The semiconductor substrate has a structure where a $p^+$-type collector region 3, an n-type buffer layer 4 and an $n^-$-type drift layer 5 are stacked in this order. The collector region 3 is a p-type semiconductor region that contains aluminum (Al) as a dopant, for example, and is formed on a lower surface of the semiconductor substrate. The buffer layer 4 and the drift layer 5 are each formed of an n-type semiconductor region that contains nitrogen (N) or phosphorus (P) as a dopant, for example. The buffer layer 4 and the drift layer 5 are formed on the collector region 3 in the semiconductor substrate. The semiconductor substrate is mainly made of SiC. The semiconductor substrate formed of the collector region 3, the buffer layer 4 and the drift layer 5 has: a main surface (first main surface) that is an upper surface of the drift layer 5; and a back surface (second main surface) that is positioned on a side opposite to the main surface and is a lower surface of the collector region 3.

From the upper surface of the drift layer 5 (an upper surface of the semiconductor substrate) to an intermediate depth of the drift layer 5, a plurality of p-type body layers 6 are formed in a spaced-apart manner from each other. Further, from upper surfaces of the body layers 6 to an intermediate depth of the body layers 6, $n^+$-type emitter regions 7 and $p^+$-type body layer contact regions (second emitter regions) 8 are formed. The emitter region 7 and the body layer contact region 8 are brought into contact with each other in a direction along the upper surface of the semiconductor substrate. A depth of the emitter region 7 and a depth of the body layer contact region 8 are substantially equal. The body layers 6 are interposed between the emitter regions 7 and the drift layer 5 in the direction along the upper surface of the semiconductor substrate so that the emitter regions 7 and the drift layer 5 are spaced apart from each other. The body layer 6 and the body layer contact region 8 are formed of a p-type semiconductor region that contains, for example, aluminum (Al) as a dopant. The emitter region 7 is formed of an n-type semiconductor region that contains, for example, nitrogen (N) or P (phosphorus) as a dopant.

Gate electrodes 10 are formed on the semiconductor substrate by way of gate insulation films 9 such that the gate electrode 10 covers an upper surface of the body layer 6 between the emitter region 7 and the drift layer 6. The gate electrode 10 is formed in a straddling manner just over at least the drift layer 5, the body layer 6 and the emitter region 7 that are arranged on the upper surface of the semiconductor substrate. In other words, the gate electrodes 10 are formed on the semiconductor substrate by way of the gate insulation films 9 in a state where the gate electrode 10 covers the body layer 6 between the emitter region 7 and the drift layer 5.

The gate insulation film 9 is made of silicon oxide, for example, while the gate electrode 10 is made of polysilicon, for example. A stacked film formed of the gate insulation film 9 and the gate electrode 10 is covered by an interlayer insulation film 11 formed on the gate electrode 10. That is, side surfaces and an upper surface of the gate electrode 10 are covered by the interlayer insulation film 11. The gate insulation film 9 may have a width larger than a width of the gate electrode 10.

A through hole (via) that penetrates the interlayer insulation film 11 from its upper surface to its lower surface is formed in the interlayer insulation film 11 at a position spaced apart from the gate electrode 10. On a bottom portion of the through hole, the emitter region 7 and the body layer contact region 8 are exposed from the interlayer insulation film 11. An emitter electrode 12 that covers the interlayer insulation film 11 is formed on the semiconductor substrate including the inside of the through holes. That is, the emitter electrode 12 is embedded in the through hole, and the emitter region 7 and the body layer contact region 8 are electrically connected to each other. Although not illustrated in the drawings, at the bottom portion of the through hole, a silicide layer may be interposed between the emitter electrode 12 and the emitter region 7 and the body layer contact region 8.

A lower surface of the collector region 3 is covered by a silicide layer 2, and a lower surface of the silicide layer 2 is covered by the collector electrode 1. A lower surface of the collector region 3 is brought into contact with the silicide layer 2, and a lower surface of the silicide layer 2 is brought into contact with the collector electrode 1. The collector electrode 1 is electrically connected to the collector region 3 via the silicide layer 2.

The silicide layer 2 contains aluminum (Al), titanium (Ti), and nickel (Ni). Since the silicide layer 2 contains Al, the collector region 3 that has Al as a dopant and the silicide layer 2 are connected to each other by an ohmic contact. Further, the silicide layer 2 contains Ti that is metal being more easily bondable to carbon (C) than Al. That is, C and Ti are more easily bondable to each other than bonding between C and Al. Accordingly, between the silicide layer 2 and the collector region 3, Ti and C are bonded to each other thus forming titanium carbide (TiC). TiC is contained in the silicide layer 2.

Further, as one main technical feature of this embodiment, the silicide layer 2 contains Ni that is metal being more easily bonded to Si than Al. That is, Si and Ni are more easily bondable to each other than bonding between Si and Al. The silicide layer 2 may contain molybdenum (Mo) or Co (cobalt) in place of Ni as metal that is more easily bondable to Si than Al. Between the silicide layer 2 and the collector region 3, Ni and Si are bondable to each other thus forming $Ni_2Si$. $Ni_2Si$ is contained in the silicide layer 2. The content of Ni in the silicide layer 2 is 10 at. % or more and 33 at. % or less. A total content of Ni and Ti in the silicide layer 2 is less than 50 at. %, and the content of Al in the silicide layer 2 is more than 50 at. %. In this manner, by setting the content of Ni in the silicide layer 2 to less than 33 at. %, the content of Al in the silicide layer 2 can be increased. As a result, it is possible to realize a low-resistant ohmic contact between the silicide layer 2 that contains a large amount of Al and the collector region 3 that contains Al as a dopant.

<Method of Manufacturing Semiconductor Device>

Hereinafter, the method of manufacturing a semiconductor device according to the embodiment is described with reference to FIG. 2 to FIG. 7. FIG. 2 to FIG. 7 are cross-sectional views of the semiconductor device according to this embodiment during manufacturing steps.

Figure 2:
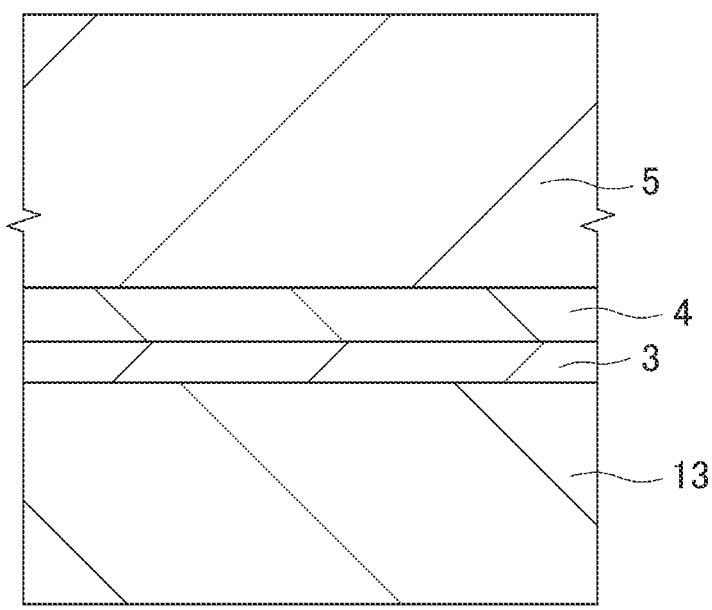
FIG. 2 is a cross-sectional view illustrating a manufacturing step of the semiconductor device according to the embodiment.

First, as illustrated in FIG. 2, the $n^+$-type silicon carbide (SiC) substrate 13 made of silicon carbide (SiC) is prepared. The SiC substrate 13 has a main surface, and a back surface on a side opposite to the main surface. Subsequently, the $p^+$-type collector region 3, the n-type buffer layer 4 and the $n^-$-type drift layer 5 are formed on an upper surface of the SiC substrate 13 in this order by an epitaxial growth method. The collector region 3 contains, for example, Al as a dopant. The buffer layer 4 and the drift layer 5 contain, for example, N or P as a dopant.

Figure 3:
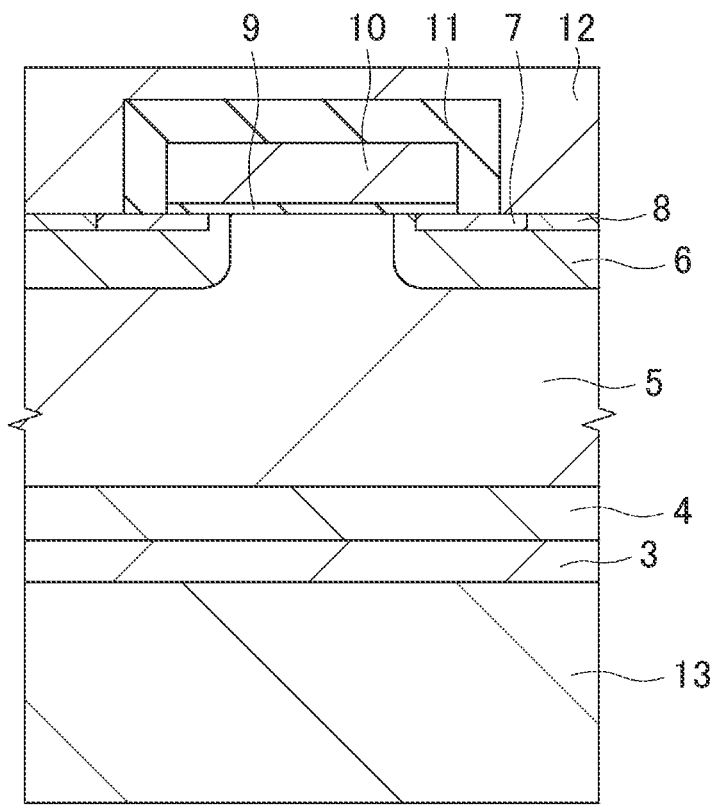
FIG. 3 is a cross-sectional view illustrating a manufacturing step of the semiconductor device according to the embodiment subsequent to the manufacturing step illustrated in FIG. 2.

Next, as illustrated in FIG. 3, on an upper surface of the drift layer 5, the p-type body layers 6, the $n^+$-type emitter region 7 and the $p^+$-type body layer contact regions 8 are formed by an ion implantation method, for example. The body layer 6, the emitter region 7 and the body layer contact region 8 are formed at the positions described above with reference to FIG. 1.

Subsequently, the gate electrodes 10 are formed on the drift layer 5 by way of the gate insulation films 9. The gate insulation films 9 are formed by a thermal oxidization method, a chemical vapor deposition (CVD) method or the like. A polysilicon film is stacked (formed) on the gate insulation film 9 by a CVD method, and patterning is applied to the polysilicon film using a photolithography technique or an etching technique thus forming the gate electrode 10 made of the polysilicon film.

Subsequently, the interlayer insulation film 11 is formed on the drift layer 5 and the gate electrodes 10 by a CVD method, for example. The interlayer insulation film 11 is made of silicon oxide, for example. Subsequently, the through hole that penetrates the interlayer insulation film 11 is formed by a photolithography method and an etching method. Accordingly, at the bottom portion of the through hole, the emitter region 7 and the body layer contact region 8 are exposed from the interlayer insulation film 11. Subsequently, the emitter electrode 12 is formed on the drift layer 5 that includes the inside of the through holes and on the interlayer insulation films 11 by a sputtering method or the like. A portion of the emitter electrode 12 is embedded in the through hole so that the emitter electrode 12 is electrically connected to the emitter region 7 and the body layer contact region 8. The emitter electrode 12 contains Al, for example. Before forming the emitter electrode 12, a silicide layer may be formed so as to cover the upper surface of the emitter region 7 and the body layer contact region 8 that are exposed at the bottom portion of the through hole. The silicide layer can be formed by a well-known silicide technique.

With such steps, the IGBT that includes the gate electrodes 10, the emitter regions 7 and the collector region 3 can be formed.

Figure 4:
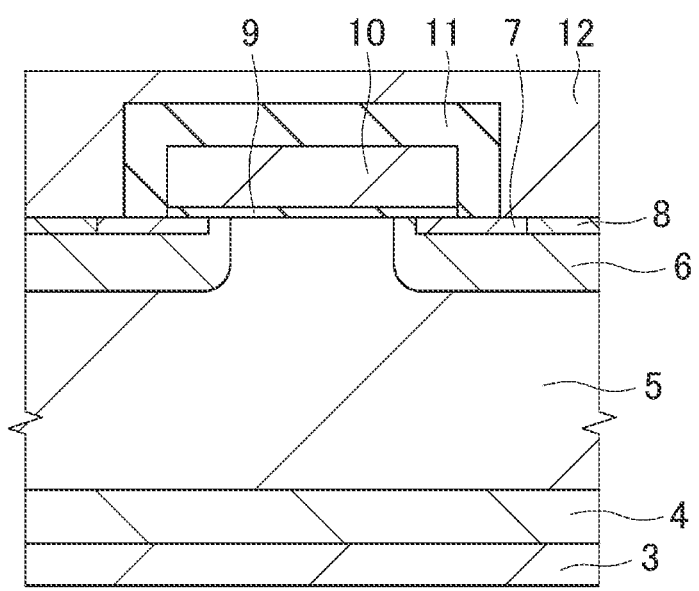
FIG. 4 is a cross-sectional view illustrating a manufacturing step of the semiconductor device according to the embodiment subsequent to the manufacturing step illustrated in FIG. 3.

Next, as shown in FIG. 4, a lower surface of the collector region 3 is exposed by removing the SiC substrate 13 by a grinding step. The semiconductor substrate (epitaxial substrate) that is formed by the grinding step and is formed of the collector region 3, the buffer layer 4 and the drift layer 5 has: a main surface (first main surface) that is an upper surface of the drift layer 5; and a back surface (second main surface) that is positioned on a side opposite to the main surface and forms a lower surface of the collector region 3. With such steps, the semiconductor substrate formed of the collector region 3, the buffer region 4 and the drift layer 5 is prepared.

Heretofore, the case is described where the SiC substrate 13 is removed after the device structure on the semiconductor substrate such as the gate electrodes is formed. However, in a case where the epitaxial substrate on the SiC substrate 13 has a sufficient strength, as illustrated in FIG. 2, the SiC substrate 13 may be removed after the epitaxial layer is formed and, then, the emitter regions 7, the gate electrodes 10 and the like may be formed.

Subsequently, the semiconductor substrate is turned upside down such that the back surface of the semiconductor substrate on which the collector region 3 is formed is directed upward.

Figure 5:
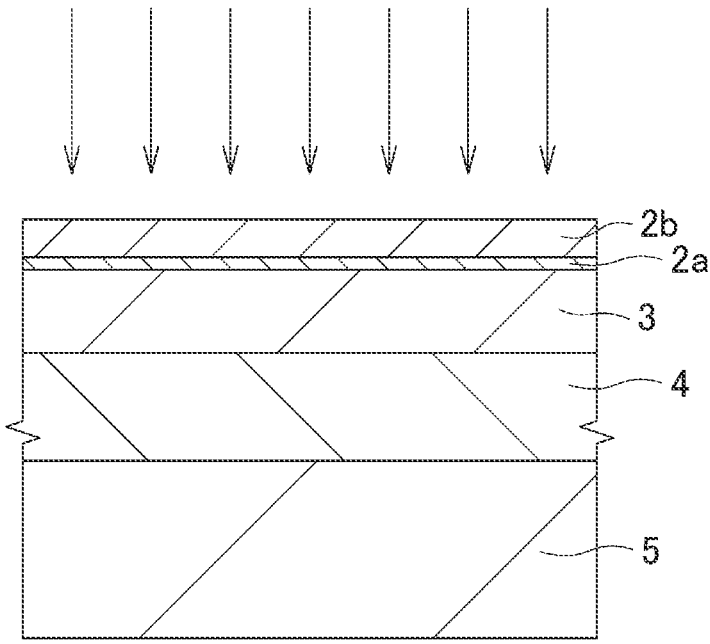
FIG. 5 is a cross-sectional view illustrating a manufacturing step of the semiconductor device according to the embodiment subsequent to the manufacturing step illustrated in FIG. 4.

Next, as illustrated in FIG. 5, a metal layer 2a made of Ni and a metal layer 2b containing Ti and Al are formed on the back surface of the semiconductor substrate (upper surface of the collector region 3) in this order. The metal layers 2a, 2b can be formed by a sputtering method, for example. In such a configuration, the collector region 3 is brought into contact with the metal layer 2a, and the collector region 3 and the metal layer 2b are spaced apart from each other via the metal layer 2a. The metal layer 2b covers the back surface of the semiconductor substrate and an upper surface of the collector region 3 (a lower surface of the collector region 3 in a case where the semiconductor substrate is not inverted as illustrated in FIG. 4). A thickness of the metal layer 2a is smaller than a thickness of the metal layer 2b. In this embodiment, the thickness of the metal layer 2a is 10 nm, for example, and the thickness of the metal layer 2b is 250 nm, for example. As a material of the metal layer 2a, Co or Mo may be used. That is, a material of the metal layer 2a may be metal that can be more easily bondable to Si than Al.

The metal layer 2b may be a layer where Ti and Al exist in mixture, or may be a stacked film formed of a Ti film and a Al film. In this embodiment, for example, the metal layer 2b made of the Al film and the Ti film is formed by stacking the Al film and the Ti film on the metal layer 2a made of Ni in this order.

Subsequently, a laser beam is irradiated toward the back surface of the semiconductor substrate on which the metal layers 2a, 2b are stacked thus performing laser annealing. In this embodiment, by performing heat treatment by laser irradiation, only an area in the vicinity of the back surface of the semiconductor substrate can be locally heated. Accordingly, it is possible to suppress a damage on the device structure on a main surface side (for example, the gate insulation films 9 and the emitter regions 7).

Figure 6:
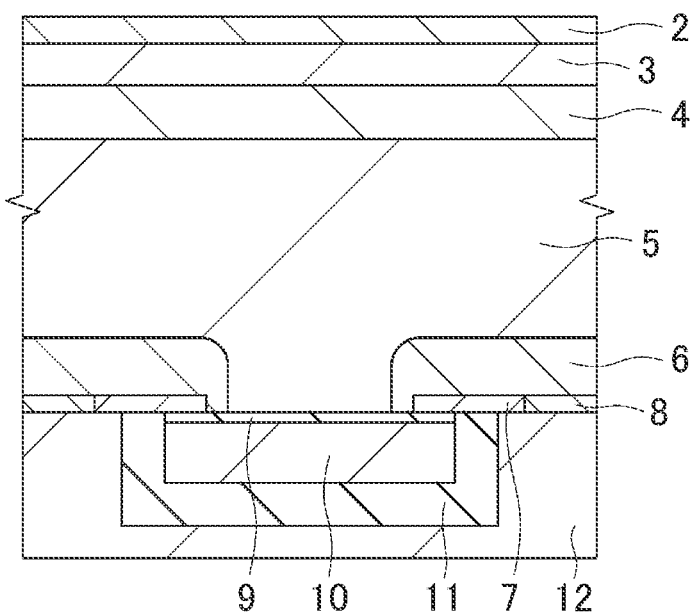
FIG. 6 is a cross-sectional view illustrating a manufacturing step of the semiconductor device according to the embodiment subsequent to the manufacturing step illustrated in FIG. 5.

As illustrated in FIG. 6, the metal layers 2a, 2b and the SiC that forms the semiconductor substrate are made to react with each other by the above-mentioned laser annealing thus forming a silicide layer 2. That is, the silicide layer 2 is brought into contact with the upper surface of the collector region 3. The silicide layer 2 contains Si, Ni, Ti and Al. Since a heating time is short in laser annealing, by setting a film thickness of the metal layer 2a that is brought into contact with the collector region 3 to less than 30 nm, it is possible to make the collector region 3 and the metal layer 2b that is not brought into contact with the collector region 3 react with each other with certainty. However, when the film thickness of the metal layer 2a is less than 10 nm, an amount of Ni is small and hence, an advantageous effect of the present invention described later is small. Accordingly, a desirable range of the thickness of the metal layer 2a is 10 nm or more and 30 nm or less. Further, the thickness of the metal layer 2b is, for example, 200 to 300 nm.

Since the metal layer 2b contains Al, the collector region 3 that contains Al as a dopant and the silicide layer 2 are connected to each other by an ohmic contact. Further, the silicide layer 2 contains Ti that is metal more easily bondable to carbon (C) than Al. Accordingly, between the silicide layer 2 and the collector region 3, Ti and C are bonded to each other thus forming titanium carbide (TiC). TiC is contained in the silicide layer 2.

Between the silicide layer 2 and the collector region 3, Ni and Si are bonded to each other thus forming $Ni_2Si$. $Ni_2Si$ is contained in the silicide layer 2. The content of Ni in the silicide layer 2 is 10 at. % or more and less than 33 at. %. A total content of Ni and Ti in the silicide layer 2 is less than 50 at. %, and the content of Al in the silicide layer 2 is larger than 50 at. %. In this manner, by setting the content of Ni in the silicide layer 2 less than 33 at. %, the content of Al in the silicide layer 2 can be increased. Accordingly, the silicide layer 2 that contains a large amount of Al and the collector region 3 that uses Al as a dopant can be connected by a low resistant ohmic contact.

Figure 7:
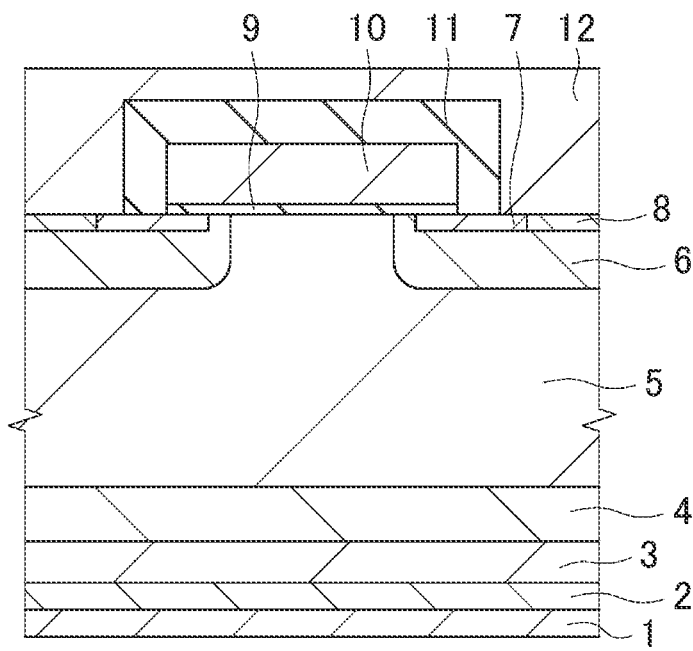
FIG. 7 is a cross-sectional view illustrating a manufacturing step of the semiconductor device according to the embodiment subsequent to the manufacturing step illustrated in FIG. 6.

Next, as illustrated in FIG. 7, the collector electrode 1 that is brought into contact with a lower surface of the silicide layer 2 is formed. The collector electrode 1 can be formed by a sputtering method, for example. The collector electrode is made of Al, gold (Au) or the like, for example. The collector electrode 1 is connected to the collector region 3 via the silicide layer 2 by an ohmic contact. Then, the semiconductor substrate is turned upside down thus obtaining the structure illustrated in FIG. 7. The IGBT according to this embodiment can be completed in accordance with the above-mentioned steps.

Advantageous Effects of this Embodiment

Next, the advantageous effects of this embodiments are described.

As described using the comparative example illustrated in FIG. 11 to FIG. 14, in the IGBT, there is room for improvement by preventing the occurrence of bipolar degradation attributed to a defect that occurs on the boundary between the back surface of the semiconductor substrate and the silicide layer.

Figure 15:
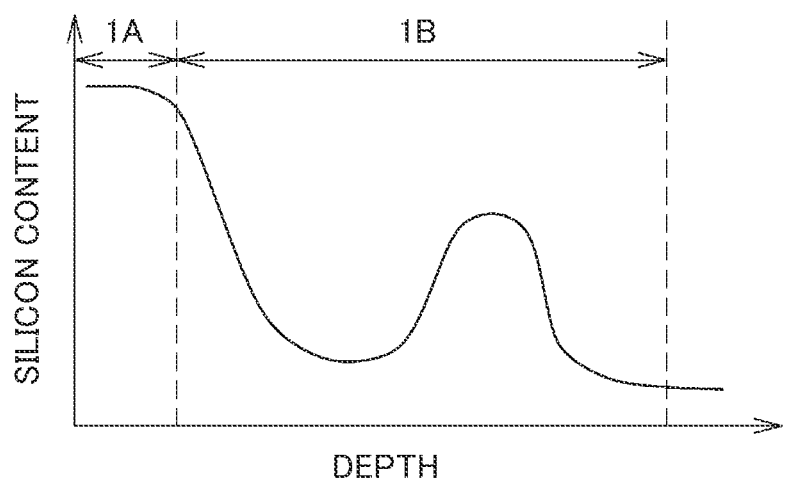
FIG. 15 is a graph illustrating a Si content in a silicide layer in the semiconductor device according to the comparison example.

Here, FIG. 15 is a graph that illustrates the distribution of Si in a depth direction in the IGBT according to the comparative example. FIG. 15 is, in the comparative example, the graph illustrating the relationship between a depth (distance) taken on an axis of abscissas and the Si content taken on an axis of ordinate. In FIG. 15, a region 1A that corresponds to a collector region and a region 1B that corresponds to a silicide layer below the collector region are illustrated.

As illustrated in FIG. 15, the content of Si in the IGBT according to the comparative example is once lowered in the silicide layer that is deeper than the collector layer. However, the content of Si is again increased in the further deeper region in the silicide layer. That is, Si is unevenly distributed in the silicide layer. Such uneven distribution of Si generates a distortion of inter-lattice distance of SiC (defect) on the lower surface of the collector region.

In view of such a situation, unlike the comparative example, in this embodiment, as the material that forms the silicide layer 2 that is brought into contact with the lower surface of the collector electrode, metal (for example, Ni) that is more easily bondable to Si than Al is added. That is, metal that is easily bondable to Si is used as silicide metal for forming the silicide layer. Further, in this embodiment, Ni that forms a compound with Si is added to the boundary between the semiconductor substrate made of SiC and the silicide layer and, then, laser annealing is performed.

Figure 8:
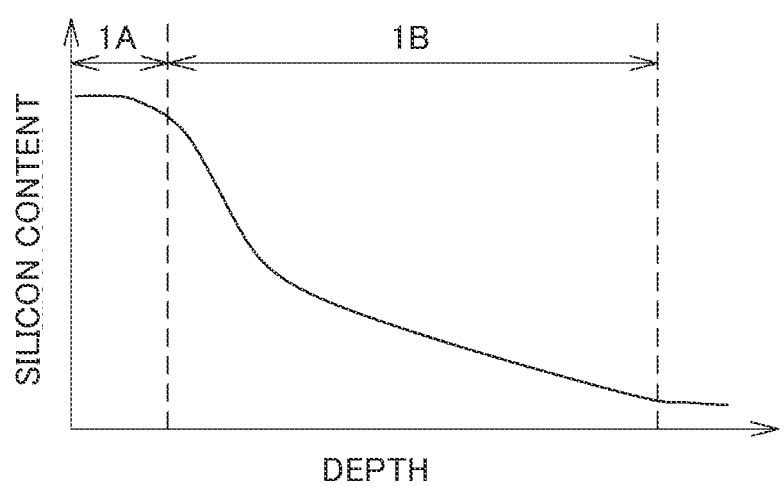
FIG. 8 is a graph illustrating an Si content in a silicide layer in the semiconductor device according to the embodiment.

By performing such steps, as illustrated in FIG. 8, the distribution where Si is monotonously decreased in the silicide layer in the depth direction is realized. FIG. 8 is a graph illustrating the relationship between the depth (distance) taken along an axis of abscissas and an Si content taken along an axis of ordinate in this embodiment. In FIG. 8, in the same manner as FIG. 15, a region 1A that corresponds to the collector region and a region 1B that corresponds to the silicide layer below the collector region are illustrated.

That is, as illustrated in FIG. 8, the uneven distribution of an amount of Si is suppressed by realizing the distribution where an amount of Si in the silicide layer is gradually decreased in the depth direction. In other words, the content of Si in the silicide layer is gradually decreased from the boundary between the silicide layer and the collector region toward the lower surface of the silicide layer. Accordingly, it is possible to suppress the generation of distortion of the inter-lattice distance at the boundary between the semiconductor substrate and the silicide layer. As a result, the formation of a defect at the boundary can be suppressed.

Figure 9:
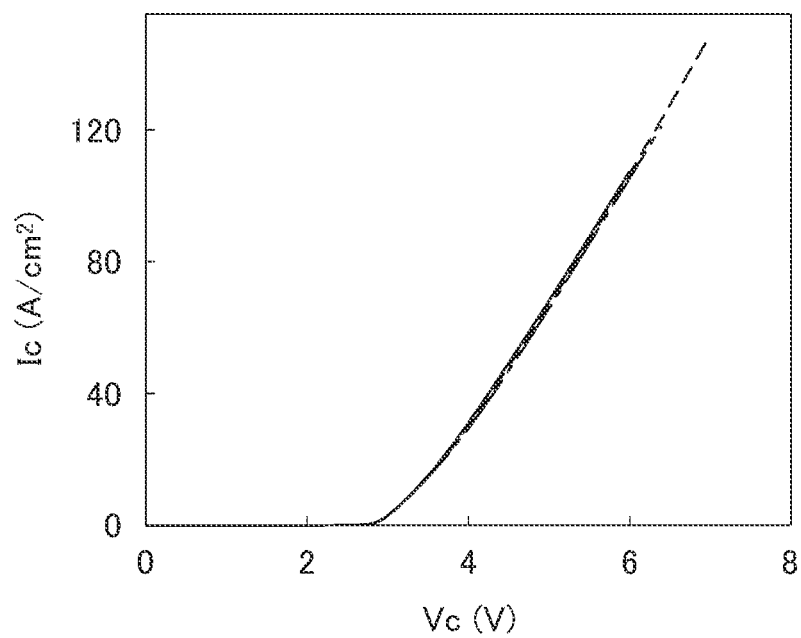
FIG. 9 is a graph illustrating a current-voltage characteristic by the supply of electricity in the semiconductor device according to the embodiment.

A graph in FIG. 9 illustrates a change in a current-voltage characteristic due to energization in the IGBT according to this embodiment. A collector voltage is taken on an axis of abscissas, and a collector current is taken on an axis of ordinate. In FIG. 9, a graph when the supply of current is started is indicated by a solid line, a graph after a lapse of 760 hours after starting the supply of current is indicated by a broken line, and a graph after a lapse of 1000 hours after starting the supply of current is indicated by a chained line. However, among three graphs indicated in FIG. 9, the difference in a current-voltage characteristic is hardly recognized. From such a phenomenon, it is understood that the IGBT according to this embodiment can suppress the bipolar degradation compared to the comparative example described with reference to FIG. 14. That is, in this embodiment, it is possible to realize the highly reliable IGBT that suppresses the bipolar degradation by suppressing the occurrence of a crystal defect.

Further, to allow the silicide layer to have an ohmic contact with the p-type SiC semiconductor substrate where Al becomes a dopant, the silicide layer that contains a large amount of Al becomes necessary However, the density of Al is small, a film thickness of the metal layer 2b illustrated in FIG. 5 becomes large. Further, laser annealing suppresses an influence to the device structure, a heating time is a short time. Accordingly, it becomes extremely important to form the metal layer 2a and the semiconductor substrate such that metal layer 2a and the semiconductor substrate react with each other as easily as possible.

In view of the above, in the manufacturing steps of the semiconductor device according to this embodiment, by forming the metal layer 2a such that the metal layer 2a is brought into contact with the semiconductor substrate, and by performing laser annealing that requires a short time as a heating time, it is possible to realize a reaction between metal that forms the metal layer 2a and Si that forms SiC with certainty.

Modification

This embodiment relates to the structure on a back surface side of the semiconductor substrate and hence, various changes can be made with respect to the structure on a main surface side of the semiconductor substrate. That is, the silicide layer according to this embodiment is applicable not only to a planar-type IGBT where the gate electrode is formed on the flat upper surface of the semiconductor substrate but also to a trench-type IGBT where a trench gate electrode is formed on an upper surface of a semiconductor substrate, for example.

Figure 10:
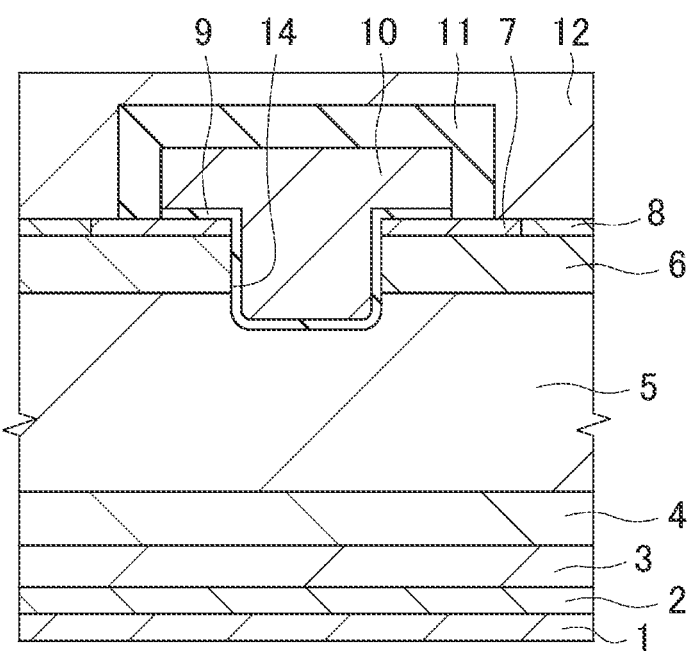
FIG. 10 is a cross-sectional view illustrating a semiconductor device according to a modification of the embodiment.

FIG. 10 illustrates a cross-sectional view of a trench-type IGBT according to a modification of the embodiment. The IGBT illustrated in FIG. 10 differs from the structure 1 illustrated in FIG. 1 with respect to a point that trenches 14 are formed from an upper surface of a semiconductor substrate (epitaxial substrate) to an intermediate depth of a drift layer 5, and a gate electrode 10 is also formed in the trench 14 besides on a main surface of the semiconductor substrate by way of a gate insulation film 9. That is, the gate electrode 10 is a trench gate electrode embedded in the trench 14. Further, in this modification, a body layer 6 and an emitter region 7 are brought into contact with the trench 14. Other constitutional elements are substantially equal to the corresponding constitutional elements of the IGBT illustrated in FIG. 1.

In manufacturing steps of a semiconductor device, after performing the steps described with reference to FIG. 2, for example, after forming the body layer 6, the emitter region 7 and the body layer contact region 8 and before forming the gate insulation film 9, the trench 14 is formed. Then, as described with reference to FIG. 3 to FIG. 6, the gate insulation film 9, the gate electrode 10, a silicide layer 2, a collector electrode 1 and the like are formed. The IGBT according to the modification illustrated in FIG. 10 can be formed in accordance with the above-mentioned manufacturing steps. The trench 14 cab be formed in such a manner that a resist pattern is formed on a semiconductor substrate using a photolithography technique, and dry etching is applied to the resist pattern using an etching preventing mask.

In this manner, also in the trench-type IGBT, by forming the silicide layer 2 according to the embodiment, it is possible to acquire substantially the same advantageous effects.

The invention made by the inventors of the present invention has been specifically described based on the embodiment. However, it is needless to say that the present invention is not limited to the above-mentioned embodiment and various modifications can be made without departing from the gist of the present invention.

For example, it is needless to say that the materials, the conductive types, the manufacturing conditions of the respective portions are not limited to the description of the above-mentioned embodiment, and various modifications can be made. Although the conductive type is fixed with respect to the semiconductor substrate and the semiconductor region for the sake of convenience of the description, the semiconductor substrate and the semiconductor region are not limited to the above-mentioned conductive type.

INDUSTRIAL APPLICABILITY

The present invention is widely applicable to a semiconductor device that includes an IGBT having a silicide layer, and a method of manufacturing the semiconductor device.

LIST OF REFERENCE SIGNS

1: collector electrode
2: silicide layer
2a, 2b: metal layer
3: collector region
4: buffer layer
5: drift layer
6: body layer
7: emitter region
8: body layer contact region
9: gate insulation film
10: gate electrode

The invention claimed is:
1. A semiconductor device comprising:
a semiconductor substrate;
a collector region of a first conductive type that is formed on a lower surface of the semiconductor substrate;
a first semiconductor region of a second conductive type that differs from the first conductive type, the first semiconductor region being formed on the collector region in the semiconductor substrate;
a second semiconductor region of the first conductive type, the second semiconductor region being formed from an upper surface of the semiconductor substrate to an intermediate depth in the first semiconductor region;
an emitter region of the second conductive type, the emitter region being formed from an upper surface of the second semiconductor region to an intermediate depth of the second semiconductor region, the emitter region being spaced apart from the first semiconductor region;
a gate electrode formed on the semiconductor substrate by way of an insulation film in a state where the gate electrode covers the second semiconductor region between the emitter region and the first semiconductor region;
a silicide layer being formed in a state where the silicide layer is brought into contact with a lower surface of the collector region; and a collector electrode being formed in a state where the collector electrode is brought into contact with a lower surface of the silicide layer, wherein the collector region, the emitter region and the gate electrode form an insulation bipolar transistor, the silicide layer contains aluminum, a first bonding metal which is bonded with silicon, and a second bonding metal which is bonded with carbon, and the semiconductor substrate contains silicon carbide.

2. The semiconductor device according to claim 1, wherein in the silicide layer, a content of the first bonding metal is less than 33 at. %.

3. The semiconductor device according to claim 2, wherein in the silicide layer, the content of the first bonding metal is 10 at. % or more.

4. The semiconductor device according to claim 1, wherein, in the silicide layer, in addition to aluminum, the first bonding metal comprises nickel, cobalt or molybdenum.

5. The semiconductor device according to claim 1, wherein a content of silicon in the silicide layer is gradually decreased from a boundary between the silicide layer and the collector region toward a lower surface of the silicide layer.

6. A method of manufacturing a semiconductor device comprising:

(a) a step of providing a semiconductor substrate that includes a main surface and a back surface which is on a side opposite to the main surface, and has a collector region of a first conductive type formed on the back surface, and a first semiconductor region of a second conductive type that differs from the first conductive type;

(b) a step of forming a second semiconductor region of the first conductive type from an upper surface of the semiconductor substrate to an intermediate depth of the first semiconductor region;

(c) a step of forming an emitter region of the second conductive type from an upper surface of the second semiconductor region to an intermediate depth of the second semiconductor region in a state where the emitter region is spaced apart from the first semiconductor region;

(d) a step of forming a gate electrode on the semiconductor substrate by way of an insulation film in a state where the gate electrode covers the second semiconductor region between the emitter region and the first semiconductor region;

(e) a step of forming a silicide layer that is brought into contact with a lower surface of the collector region after the step (a); and (f) a step of forming a collector electrode that is brought into contact with a lower surface of the silicide layer after the step (e), wherein the collector region, the emitter region and the gate electrode form an insulation gate bipolar transistor, the silicide layer contains aluminum, a first bonding metal which is bonded with silicon, and a second bonding metal which is bonded with carbon, and the semiconductor substrate contains silicon carbide.

7. The method of manufacturing a semiconductor device according to claim 6, wherein the step (e) includes:

(e1) a step of forming a first metal layer that is brought into contact with a lower surface of the collector region and contains the first bonding metal;

(e2) a step of forming a second metal layer that covers a lower surface of the first metal layer, and contains aluminum and the second bonding metal; and (e3) step of forming the silicide layer by making the semiconductor substrate, the first metal layer and the second metal layer react with each other by heat treatment.

8. The method of manufacturing a semiconductor device according to claim 7, wherein in the (e3) step, the heat treatment is performed by irradiating laser toward the lower surface of the semiconductor substrate from the second metal layer side.

9. The method of manufacturing a semiconductor device according to claim 7, wherein a film thickness of the first metal layer is less than 30 nm.

10. The method of manufacturing a semiconductor device according to claim 9, wherein the film thickness of the first metal layer is more than 10 nm.

11. The method of manufacturing a semiconductor device according to claim 6, wherein, in the silicide layer, in addition to aluminum, the first bonding metal comprises nickel, cobalt or molybdenum.

* * * * *